(12) United States Patent
Chang et al.

(10) Patent No.: US 12,334,887 B2
(45) Date of Patent: Jun. 17, 2025

(54) VARIABLE GAIN AMPLIFIER CIRCUIT AND METHOD HAVING LINEARITY COMPENSATION MECHANISM

(71) Applicant: REALTEK SEMICONDUCTOR CORPORATION, Hsinchu (TW)

(72) Inventors: Yang Chang, Hsinchu (TW); Chia-Jun Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 271 days.

(21) Appl. No.: 18/087,261

(22) Filed: Dec. 22, 2022

(65) Prior Publication Data

US 2023/0231525 A1 Jul. 20, 2023

(30) Foreign Application Priority Data

Jan. 20, 2022 (TW) .................................. 111102362

(51) Int. Cl.
*H03F 3/45* (2006.01)
*H03G 1/00* (2006.01)
*H03G 3/10* (2006.01)

(52) U.S. Cl.
CPC ........... *H03G 1/007* (2013.01); *H03G 1/0023* (2013.01); *H03G 1/0088* (2013.01)

(58) Field of Classification Search
CPC .... H03G 1/007; H03G 1/0029; H03G 1/0088; H03G 1/0023; H03G 3/3042; H03G 3/30; H03G 3/3036; H03G 3/001; H03G 1/0005

(Continued)

(56) References Cited

U.S. PATENT DOCUMENTS 6,211,737 B1  4/2001  Fong
6,710,657 B2 *  3/2004  Yang ................... H03G 1/0023
                                                  330/254

(Continued)

OTHER PUBLICATIONS

1) OA letter of a counterpart TW application (appl. No. 111102362) mailed on Oct. 21, 2022.2) Summary of the TW OA letter in regard to TW counterpart application:1. Claims 1 and 9-10 are rejected as allegedly being unpatentable in view of cited reference 1 (U.S. Pat. No 6,211,737 B1) and cited reference 2 (US20060261893 A1).2. Claimes 2-8 are allowable. Correspondence between claims of TW counterpart application and claims of US application:1. Claims 1, 2-3, . . . , and 10 in TW counterpart application correspond to claims 1, 2-3, . . . 9 and 11 in US application, respectively.

*Primary Examiner* — Khanh V Nguyen
(74) *Attorney, Agent, or Firm* — WPAT, PC (57) ABSTRACT

The present invention discloses a variable gain amplifier circuit having linearity compensation mechanism is provided. A lower amplification transistor of a lower branch of an amplification circuit is controlled by an AC input signal. Upper amplification transistors of an upper branch generate an AC output signal at an amplification output terminal. An amplification control circuit controls the turn-on and turn-off of the upper amplification transistor according to an amplification control voltage. An inductor is electrically coupled between a power supply terminal and the amplification output terminal. In a gain adjustment circuit, each of adjustment control circuits controls the turn-on and turn-off of each of adjustment transistors according to a adjustment control voltage. A first voltage adjustment circuit adjusts an impedance of each of the adjustment transistors to further adjust an AC cross voltage relation between the lower amplification transistor and the upper amplification transistors.

20 Claims, 5 Drawing Sheets

(58) Field of Classification Search
USPC .......................................................... 330/278
See application file for complete search history.

(56) References Cited

U.S. PATENT DOCUMENTS

| | | | |
|---|---|---|---|
| 7,120,411 B2* | 10/2006 | Darabi | H03G 3/3052 |
| | | | 375/345 |
| 7,456,689 B2* | 11/2008 | Shimizu | H03F 3/45179 |
| | | | 330/311 |
| 2006/0261893 A1 | 11/2006 | Chiang | |

* cited by examiner

VARIABLE GAIN AMPLIFIER CIRCUIT AND METHOD HAVING LINEARITY COMPENSATION MECHANISM

BACKGROUND OF THE INVENTION

1. Field of the Invention

The present invention relates to a variable gain amplification circuit and a variable gain amplification method having linearity compensation mechanism.

2. Description of Related Art

A variable gain amplifier (VGA) can be used in a communication system to perform amplification with different gains on a signal of the RF circuit, in which the variable gain amplifier can be disposed in an analog front end circuit in a signal transceiver of the communication system.

For a cascode variable gain amplification circuit, the circuit configuration is varied in order to adjust the gain. However, the variation of the circuit configuration usually results in the variation of the impedance such that a waveform of an output voltage is distorted. Such a design thus can not meet the requirements to output an undistorted waveform no matter what gain is used. The linearity can not be kept.

SUMMARY OF THE INVENTION

In consideration of the problem of the prior art, an object of the present invention is to supply a variable gain amplification circuit and a variable gain amplification method having linearity compensation mechanism.

The present invention discloses a variable gain amplification circuit having linearity compensation mechanism that includes an amplification circuit and a gain adjustment circuit. The amplification circuit includes a lower branch, an upper branch, a plurality of amplification control circuits and an inductor. The lower branch includes a lower amplification transistor electrically coupled between a connection terminal and a ground terminal and configured to be controlled by an AC input signal. The upper branch includes a plurality of upper amplification transistors electrically coupled in parallel between an amplification output terminal and the connection terminal, wherein the amplification output terminal is configured to generate an AC output signal. Each of the amplification control circuits is configured to control one of the upper amplification transistors to turn on and turn off according to an amplification control voltage and is electrically coupled between a power supply terminal to operate according to a supply power of the power supply terminal. The inductor is electrically coupled between the power supply terminal and the amplification output terminal. The gain adjustment circuit includes a plurality of adjustment transistors, a plurality of adjustment control circuits and a first voltage adjustment circuit. The adjustment transistors are electrically coupled in parallel between the power supply terminal and the connection terminal. Each of the adjustment control circuits is configured to control one of the adjustment transistors to turn on and turn off according to an adjustment control voltage. The first voltage adjustment circuit is electrically coupled between the power supply terminal and the adjustment control circuits to adjust an impedance of the adjustment transistors to further adjust an AC cross voltage relation between the lower amplification transistor and at least one of the upper amplification transistors that is turned on.

The present invention also discloses a variable gain amplification method having linearity compensation mechanism used in a variable gain amplification circuit that comprises an amplification circuit and a gain adjustment circuit. The variable gain amplification method includes steps outlined below. A lower amplification transistor electrically coupled between a connection terminal and a ground terminal is controlled by an AC input signal, wherein the lower amplification transistor is included by a lower branch of an amplification circuit. An AC output signal is generated at an amplification output terminal by a plurality of upper amplification transistors electrically coupled in parallel between the amplification output terminal and the connection terminal, wherein the upper amplification transistors are included by an upper branch of the amplification circuit. One of the upper amplification transistors is controlled to turn on and turn off according to an amplification control voltage by each of a plurality of amplification control circuits electrically coupled between a power supply terminal to operate according to a supply power of the power supply terminal. An inductor is electrically coupled between the power supply terminal and the amplification output terminal. A plurality of adjustment transistors of a gain adjustment circuit are electrically coupled in parallel between the power supply terminal and the connection terminal. One of the adjustment transistors is controlled to turn on and turn off by one of a plurality of adjustment control circuits of the gain adjustment circuit according to an adjustment control voltage. A first voltage adjustment circuit of the gain adjustment circuit is electrically coupled between the power supply terminal and the adjustment control circuits to adjust an impedance of the adjustment transistors to further adjust an AC cross voltage relation between the lower amplification transistor and at least one of the upper amplification transistors that is turned on.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide a variable gain amplification circuit and a variable gain amplification method having linearity compensation mechanism to adjust the impedance relation between the lower branch and the upper branch by disposing the first voltage adjustment circuit when the gain adjustment circuit adjusts the gain to further adjust the cross voltage relation between the lower branch and the upper branch. As a result, the variable gain amplification circuit can compensate the linearity when the gain varies to maintain a better linearity.

Figure 1:
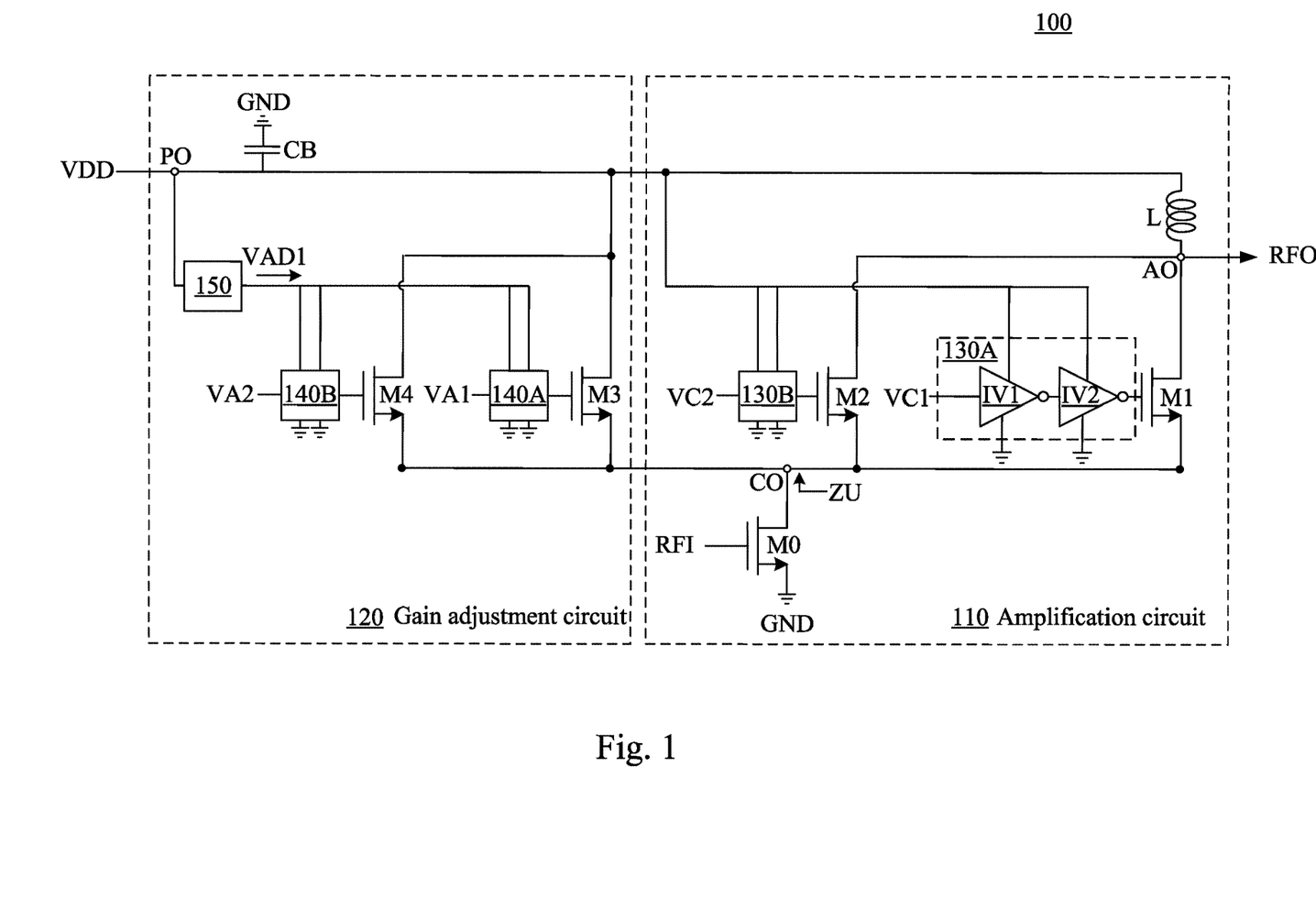
FIG. 1 illustrates a circuit diagram of a variable gain amplification circuit having linearity compensation mechanism according to an embodiment of the present invention.

Reference is now made to FIG. 1. FIG. 1 illustrates a circuit diagram of a variable gain amplification circuit 100 having linearity compensation mechanism according to an embodiment of the present invention. The variable gain amplification circuit 100 includes an amplification circuit 110 and a gain adjustment circuit 120.

The variable gain amplification circuit 100 is configured to operate according to a supply power VDD such that the amplification circuit 110 performs amplification on an alternating current (AC) input signal RFI to generate an AC output signal RFO. Further, by disposing the gain adjustment circuit 120, the gain between the AC output signal RFO and the AC input signal RFI can be adjusted.

In an embodiment, the variable gain amplification circuit 100 can receive the supply power VDD from a power supply terminal PO through such as, but not limited to a low-dropout regulator (not illustrated). Further, the variable gain amplification circuit 100 can output the AC output signal RFO through an amplification output terminal AO to such as, but not limited to a mixer (not illustrated) and further to be outputted by an antenna.

The configuration and operation of the variable gain amplification circuit 100 are described in detail in the following paragraphs.

The amplification circuit 110 includes a lower branch, an upper branch, a plurality of amplification control circuits 130A and 130B and an inductor L.

The lower branch includes a lower amplification transistor M0 electrically coupled between a connection terminal CO and a ground terminal GND. In the present embodiment, the lower amplification transistor M0 is an N-type MOS transistor and receives the AC input signal RFI through a gate thereof. As a result, the lower amplification transistor M0 is configured to be controlled by the AC input signal RFI.

The upper branch includes a plurality of upper amplification transistors electrically coupled in parallel between the amplification output terminal AO and the connection terminal CO. Two upper amplification transistors M1 and M2 are exemplarily illustrated in FIG. 1. However, the number of the upper amplification transistors is not limited thereto. In the present embodiment, each of the upper amplification transistors M1 and M2 is an N-type MOS transistor. The amplification output terminal AO is configured to generate the AC output signal RFO according to the operation of the upper amplification transistors M1 and M2.

Each of the amplification control circuits 130A and 130B controls one of the upper amplification transistors M1 and M2 to turn on and turn off according to the amplification control voltages VC1 and VC2. The amplification control circuits 130A and 130B are electrically coupled to the power supply terminal PO to operate according to the supply power VDD from the power supply terminal PO.

In an embodiment, each of the amplification control circuits 130A and 130B includes a plurality of inverters coupled in series. Take the amplification control circuit 130A as an example, the amplification control circuit 130A includes such as, but not limited to two inverters IV1 and IV2 illustrated in FIG. 1. The inverters IV1 and IV2 are coupled to the power supply terminal PO and operate according to the supply power VDD from the power supply terminal PO.

As a result, the amplification control circuit 130A receives and outputs the amplification control voltage VC1 to the gate of the upper amplification transistor M1 through the two inverters IV1 and IV2 to control the upper amplification transistor M1 to turn on and turn off according to the high state and the low state of the amplification control voltage VC1. Similarly, the amplification control circuit 130B can receive and output the amplification control voltage VC2 through the same configuration (not illustrated) to the gate of the upper amplification transistors M2 and control the upper amplification transistor M2 to turn on and turn off according to the high state and the low state of the amplification control voltage VC2.

In other embodiments, the amplification control circuits 130A and 130B may include other numbers of inverters. When the number is even, the upper amplification transistors M1 and M2 are controlled to be turned on and turned off respectively according to the high state and the low state of the amplification control voltages VC1 and VC2. When the number is odd, the upper amplification transistors M1 and M2 are controlled to be turned on and turned off respectively according to the low state and the high state of the amplification control voltages VC1 and VC2.

In an embodiment, when at least one of the upper amplification transistors M1 and M2 turns on, the AC input signal RFI in the form of the small signal is transmitted to at least one of the upper amplification transistors M1 and M2 that is turned on through the lower amplification transistor M0 to be amplified. When the number of the upper amplification transistors M1 and M2 that are turned on increases, a gain of the AC output signal RFO relative to the AC input signal RFI increases accordingly.

The inductor L is electrically coupled between the power supply terminal PO and the amplification output terminal AO. When the inductor L has an impedance that is high enough, the small signal is not grounded and is outputted from the amplification output terminal AO to generate the AC output signal RFO.

The gain adjustment circuit 120 includes a plurality of adjustment transistors, a plurality of adjustment control circuits 140A and 140B and a first voltage adjustment circuit 150.

The adjustment transistors are electrically coupled in parallel between the power supply terminal PO and the connection terminal CO. In FIG. 1, two adjustment transistors M3 and M4 each being an N-type MOS transistor are exemplarily illustrated. However, the number and the type of the adjustment transistors are not limited thereto.

Each of the adjustment control circuits 140A and 140B controls one of the adjustment transistors M3 and M4 to turn on and turn off according to one of adjustment control voltages VA1 and VA2. The first voltage adjustment circuit 150 is electrically coupled between the power supply terminal PO and the adjustment control circuits 140A and 140B to adjust the supply power VDD to generate a first adjustment power VAD1 such that the adjustment control circuits 140A and 140B operate according to the first adjustment power VAD1.

In an embodiment, similar to the amplification control circuits 130A and 130B, each of the adjustment control circuits 140A and 140B includes a plurality of inverters coupled in series that receive the first adjustment power VAD1 and operate according to the first adjustment power VAD1 generated by the first voltage adjustment circuit 150.

As a result, the adjustment control circuit 140A and outputs the adjustment control voltage VA1 to the gate of the adjustment transistor M3 through the inverters (not illustrated) to control the adjustment transistor M3 to turn on and turn off. Similarly, the adjustment control circuit 140B can receive and output the adjustment control voltage VA2 through the same configuration (not illustrated) to the gate of the adjustment transistor M4 and control the adjustment transistor M4 to turn on and turn off.

When at least one of the adjustment transistors M3 and M4 turns on, a part of the AC input signal RFI in the form of the small signal is transmitted to at least one of the adjustment transistors M3 and M4 through the lower amplification transistor M0.

The variable gain amplification circuit 100 may further include a bypass capacitor CB electrically coupled between the power supply terminal PO and the ground terminal GND such that a part of the AC input signal RFI is transmitted through the adjustment transistors M3 and M4 and is AC grounded to decrease the gain of the AC output signal RFO generated at the amplification output terminal AO relative to the AC input signal RFI. When the number of the adjustment transistors M3 and M4 that are turned increases, the gain of the AC output signal RFO relative to the AC input signal RFI decreases.

The first voltage adjustment circuit 150 can adjust the impedance ZU seen through the adjustment transistors M3 and M4 to further adjust an AC cross voltage relation between the lower amplification transistor M0 and the upper amplification transistors M1 and M2 that are turned on. The term "AC cross voltage" stands for the AC voltage difference between the drain and the source of each of the transistors.

Figure 2A:
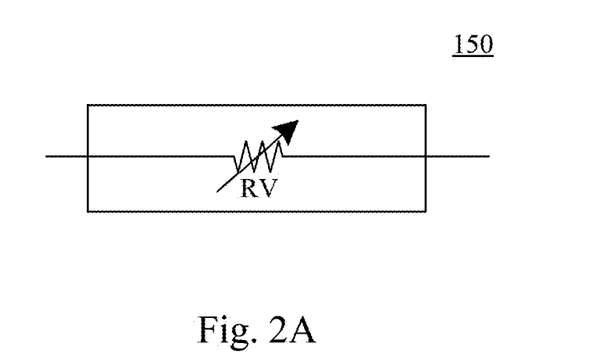
FIG. 2A to FIG. 2C respectively illustrate a detailed circuit diagram of the first voltage adjustment circuit 150 according to an embodiment of the present invention.
Figure 2B:
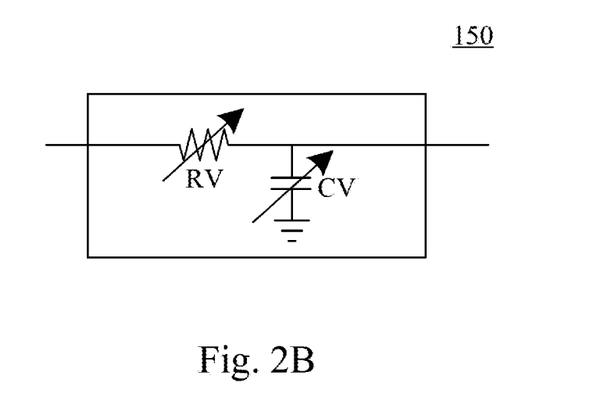
Figure 2C:
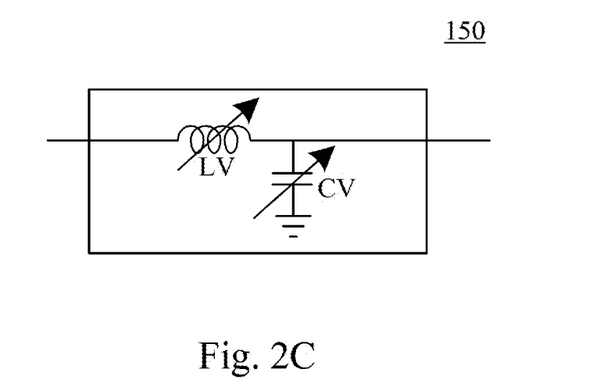

Reference is now made to FIG. 2A to FIG. 2C. FIG. 2A to FIG. 2C respectively illustrate a detailed circuit diagram of the first voltage adjustment circuit 150 according to an embodiment of the present invention.

In different embodiments, the first voltage adjustment circuit 150 may included a variable resistor, a variable capacitor, a variable inductor or a combination thereof. The first voltage adjustment circuit 150 illustrated in FIG. 2A only includes a variable resistor RV. The first voltage adjustment circuit 150 illustrated in FIG. 2B includes the variable resistor RV and a variable capacitor CV. The first voltage adjustment circuit 150 illustrated in FIG. 2C includes a variable inductor LV and the variable capacitor CV.

It is appreciated that the circuit configurations of the first voltage adjustment circuit 150 illustrated in FIG. 2A to FIG. 2C are merely an example. In other embodiments, the first voltage adjustment circuit 150 may include different numbers of the variable resistor, the variable capacitor and the variable inductor or a different connection configurations of the components described above.

In an embodiment, the variable resistor RV (as illustrated in FIG. 2B) is configured to adjust an AC cross voltage amount relation between the lower amplification transistor M0 and at least one of the upper amplification transistors M1 and M2 that is turned on. The AC cross voltage amount relation makes the AC cross voltage of the at least one of the upper amplification transistors M1 and M2 that is turned on have a headroom larger than a predetermined value.

In an embodiment, variable capacitor CV (as illustrated in FIG. 2B) and variable inductor LV (as illustrated in FIG. 2C) are configured to adjust an AC cross voltage phase relation between the lower amplification transistor M0 and at least one of the upper amplification transistors M1 and M2 that is turned on. The AC cross voltage phase relation makes the AC cross voltage of each of the lower amplification transistor and the at least one of the upper amplification transistors that is turned on have an aligned phase.

Take the lower amplification transistor M0 and the upper amplification transistors M1 as an example, the adjustment of the AC cross voltage relation performed by the first voltage adjustment circuit 150 is described in the following paragraphs.

Figure 3:
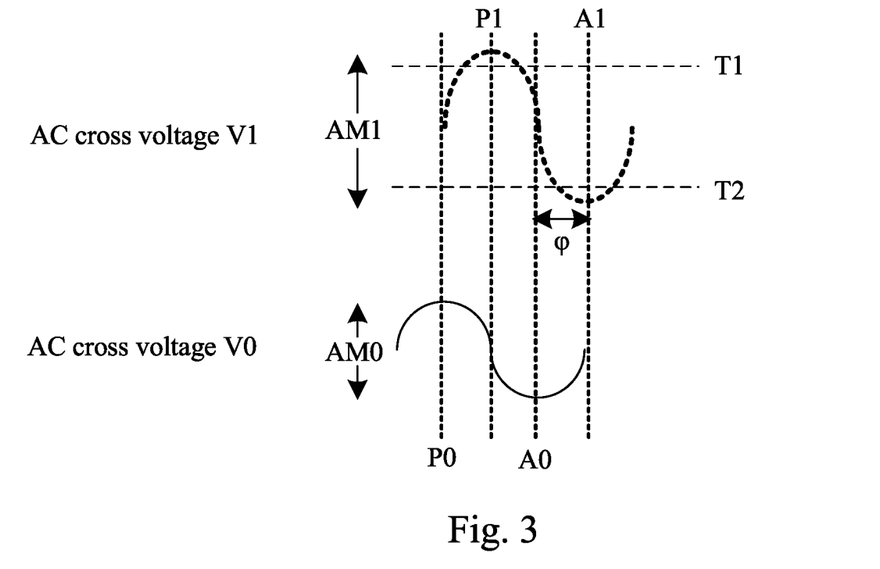
FIG. 3 illustrates a waveform diagram of an AC cross voltage of the lower amplification transistor and an AC cross voltage of the upper amplification transistor before the linearity compensation is performed on the first voltage adjustment circuit according to an embodiment of the present invention.
Figure 4:
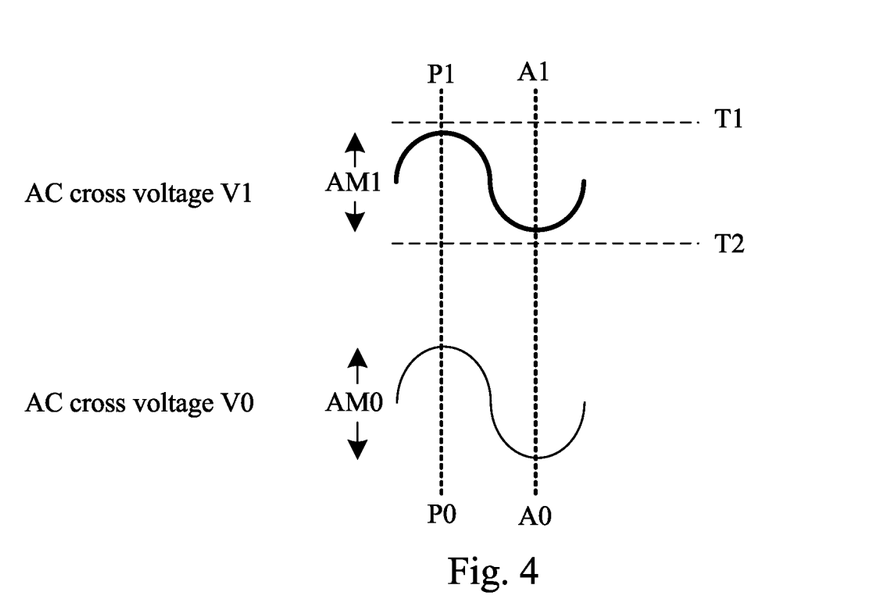
FIG. 4 illustrates a waveform diagram of the AC cross voltage of the lower amplification transistor and the AC cross voltage of the upper amplification transistor after the linearity compensation is performed on the first voltage adjustment circuit according to an embodiment of the present invention.

Reference is now made to FIG. 3 and FIG. 4 at the same time. FIG. 3 illustrates a waveform diagram of an AC cross voltage V0 of the lower amplification transistor M0 and an AC cross voltage V1 of the upper amplification transistor M1 before the linearity compensation is performed on the first voltage adjustment circuit 150 according to an embodiment of the present invention. FIG. 4 illustrates a waveform diagram of the AC cross voltage V0 of the lower amplification transistor M0 and the AC cross voltage V1 of the upper amplification transistor M1 after the linearity compensation is performed on the first voltage adjustment circuit 150 according to an embodiment of the present invention.

In FIG. 3 and FIG. 4, the AC cross voltage V0 has an amount AM0, a peak position P0 and a valley position A0. The AC cross voltage V1 has an amount AM1, a peak position P1 and a valley position A1.

When the variable gain amplification circuit 100 adjusts the gain by using the mechanism described above, the impedance ZU labeled in FIG. 1 seen by the lower amplification transistor M0 toward the upper half of the circuit relative to the connection terminal CO varies along with the variations of the numbers of the upper amplification transistors M1 and M2 and the adjustment transistors M3 and M4 that are turned on. As a result, the amount relation and the phase relation between the AC cross voltage V0 and the AC cross voltage V1 vary accordingly.

When the impedance ZU decreases since the number of the transistors coupled in parallel increases, the amount AM0 of the AC cross voltage V0 decreases and the amount AM1 of the AC cross voltage V1 increases. Under the condition that the linearity compensation mechanism of the first voltage adjustment circuit 150 is absent, the amount of the AC cross voltage V1 that is allowed to be increased is limited by the direct current (DC) bias voltage of the upper amplification transistors M1, in which the waveform of the AC cross voltage V1 is distorted when the amount of the AC cross voltage V1 exceeds the threshold values T1 and T2 illustrated as dashed lines in FIG. 3.

Under such a condition, the first voltage adjustment circuit 150 may include the variable resistor RV such that the impedance ZU seen by the lower amplification transistor M0 toward the upper half of the circuit relative to the connection terminal CO is increased when the resistance of the variable resistor RV is higher. The amount AM1 of the AC cross voltage V1 of the upper amplification transistors M1 is decreased accordingly.

As a result, the adjusted amount AM0 of the AC cross voltage makes the AC cross voltage V1 be within the threshold values T1 and T2 and having a headroom relative to each of the threshold values T1 and T2 that is larger than a predetermined value, as illustrated in FIG. 4.

On the other hand, when the gain is adjusted by using the mechanism performed by the variable gain amplification circuit 100 described above, the phases of the AC cross voltage V0 and the AC cross voltage V1 are adjusted such that the phases are not aligned, as illustrated in FIG. 3. The peak position P0 and the valley position A0 of the AC cross voltage V0 are different from the peak position P1 and the valley position A1 of the AC cross voltage V1 such that a phase difference φ is presented.

Under such a condition, the first voltage adjustment circuit 150 may include the variable capacitor CV and/or the variable inductor LV such that the real part and the imaginary part of the impedance ZU seen by the lower amplification transistor M0 toward the upper half of the circuit relative to the connection terminal CO are adjusted when the capacitance of the variable capacitor CV and/or the inductance of the variable inductor LV vary. The phase relation between the AC cross voltage V1 and the AC cross voltage V0 are thus adjusted.

As a result, the adjusted AC cross voltage phase relation makes the phases of the AC cross voltage V1 and the AC cross voltage V0 aligned, as illustrated in FIG. 4. As a result, the peak position P0 of the AC cross voltage V0 is aligned with the peak position P1 of the AC cross voltage V1, and the valley position A0 of the AC cross voltage V0 is aligned with the valley position A1 of the AC cross voltage V1. The phase difference φ is eliminated.

In an embodiment, the first voltage adjustment circuit 150 adjusts the AC cross voltage relation under the condition that the gain is not affected.

The variable gain amplification circuit having linearity compensation mechanism of the present invention adjusts the impedance relation between the lower branch and the upper branch by disposing the first voltage adjustment circuit when the gain adjustment circuit adjusts the gain to further adjust the cross voltage relation between the lower branch and the upper branch. As a result, the variable gain amplification circuit can compensate the linearity when the gain varies to maintain a better linearity.

Figure 5:
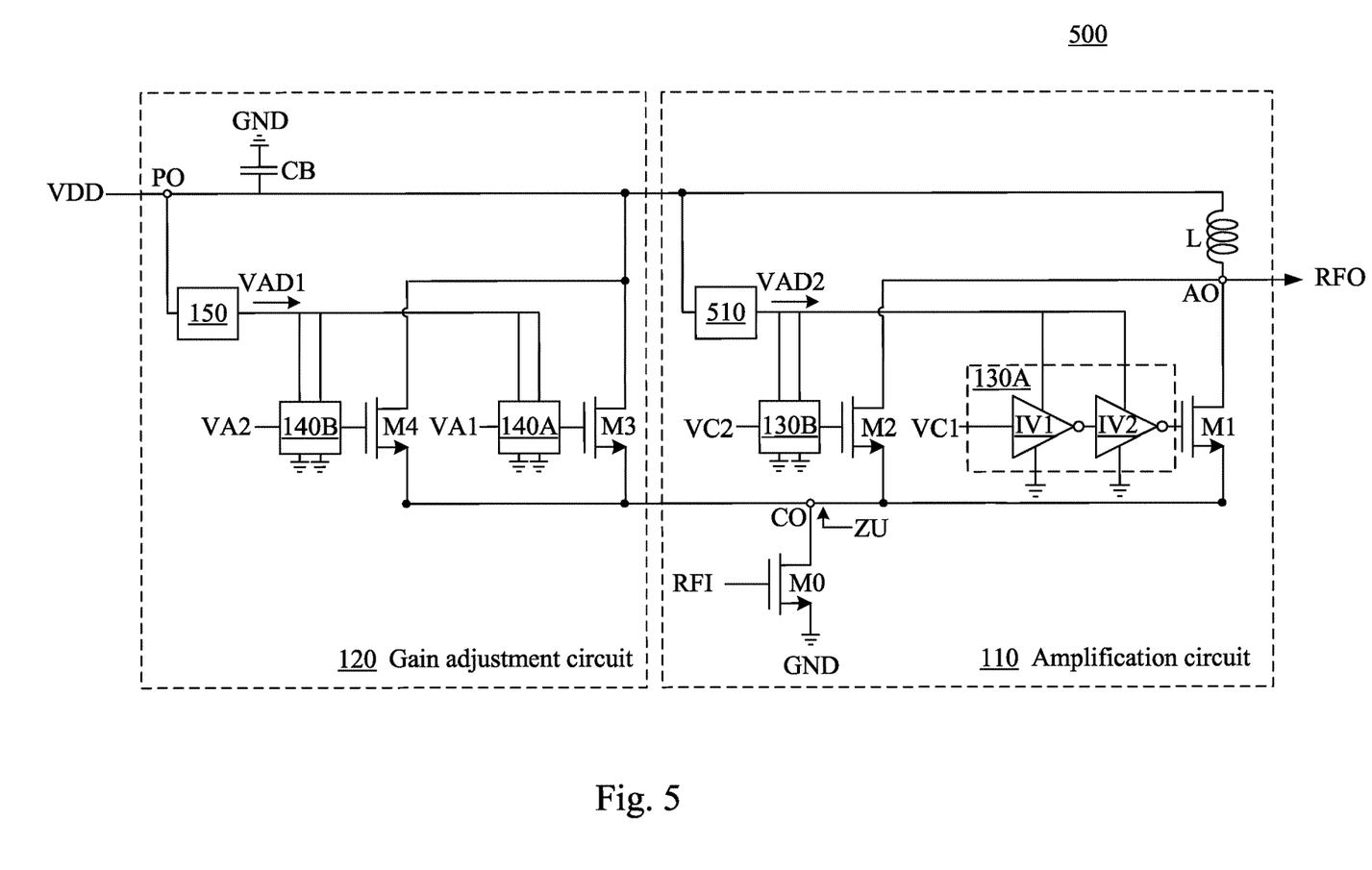
FIG. 5 illustrates a circuit diagram of a variable gain amplification circuit having linearity compensation mechanism according to an embodiment of the present invention.

Reference is now made to FIG. 5. FIG. 5 illustrates a circuit diagram of a variable gain amplification circuit 500 having linearity compensation mechanism according to an embodiment of the present invention.

Similar to the variable gain amplification circuit 100 illustrated in FIG. 1, the variable gain amplification circuit 500 includes the amplification circuit 110 and the gain adjustment circuit 120. The identical components are not further described herein. However, in the present embodiment, besides the lower branch, the upper branch, the amplification control circuits 130A and 130B and the inductor L, the amplification circuit 110 further includes a second voltage adjustment circuit 510.

Similar to the configuration and the operation of the first voltage adjustment circuit 150, the second voltage adjustment circuit 510 is electrically coupled between the power supply terminal PO and the amplification control circuits 130A and 130B to adjust the impedance of each of the upper amplification transistors M1 and M2 to further adjust the AC cross voltage relation between the lower amplification transistor M0 and the at least one of the upper amplification transistors M1 and M2 that is turned on.

As a result, the variable gain amplification circuit 500 can perform the impedance adjustment by using the first voltage adjustment circuit 150 and/or the second voltage adjustment circuit 510 to accomplish the object of linearity compensation.

In an embodiment, the variable gain amplification circuit (e.g., the variable gain amplification circuits 100 and 500) can perform an offline test to obtain the required adjustment levels of the impedance that the first voltage adjustment circuit and the second voltage adjustment circuit can provide under different conditions of the gain. In operation, when the variable gain amplification circuit switches the number of the upper amplification transistors that are turned on and the number of the adjustment transistors that are turned on to obtain the required gain, the impedance can be adjusted simultaneously by using the first voltage adjustment circuit and the second voltage adjustment circuit to accomplish the object of linearity compensation.

In another embodiment, the variable gain amplification circuit can detect the variation of the impedance generated due to the variation of the number of the of the upper amplification transistors that are turned on and the number of the adjustment transistors that are turned on in a real time manner, and adjust the impedance by using the first voltage adjustment circuit and the second voltage adjustment circuit to accomplish the object of linearity compensation.

Figure 6:
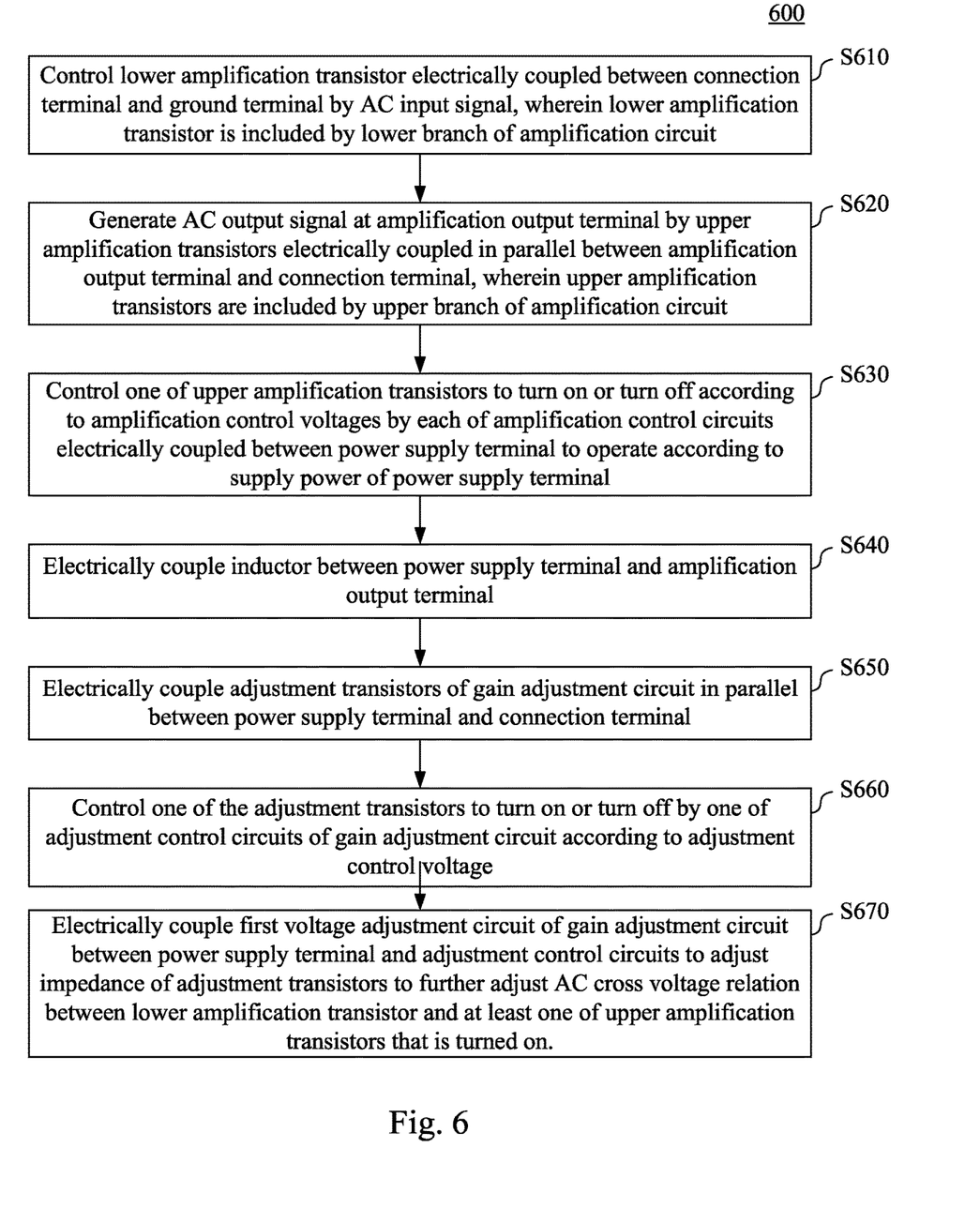
FIG. 6 illustrates a flow chart of a variable gain amplification method having linearity compensation mechanism according to an embodiment of the present invention.

Reference is now made to FIG. 6. FIG. 6 illustrates a flow chart of a variable gain amplification method 600 having linearity compensation mechanism according to an embodiment of the present invention.

In addition to the apparatus described above, the present disclosure further provides the variable gain amplification method 600 having linearity compensation mechanism that can be used in such as, but not limited to, the variable gain amplification circuit 100 in FIG. 1. As illustrated in FIG. 6, an embodiment of the variable gain amplification method 600 includes the following steps.

In step S610, the lower amplification transistor M0 electrically coupled between the connection terminal CO and the ground terminal GND is controlled by the AC input signal RFI, wherein the lower amplification transistor M0 is included by the lower branch of the amplification circuit 110.

In step S620, the AC output signal RFO is generated at the amplification output terminal AO by the upper amplification transistors M1 and M2 electrically coupled in parallel between the amplification output terminal AO and the connection terminal CO, wherein the upper amplification transistors M1 and M2 are included by the upper branch of the amplification circuit 110.

In step S630, one of the upper amplification transistors M1 and M2 is controlled to turn on and turn off according to the amplification control voltages VC1 and VC2 by each of the amplification control circuits 130A and 130B electrically coupled between the power supply terminal PO to operate according to the supply power VDD of the power supply terminal PO.

In step S640, the inductor L is electrically coupled between the power supply terminal PO and the amplification output terminal AO.

In step S650, the adjustment transistors M3 and M4 of the gain adjustment circuit 120 are electrically coupled in parallel between the power supply terminal PO and the connection terminal CO.

In step S660, one of the adjustment transistors M3 and M4 is controlled to turn on and turn off by one of the adjustment control circuits 140A and 140B of the gain adjustment circuit 120 according to the adjustment control voltages VA1 and VA2.

In step S670, the first voltage adjustment circuit 150 of the gain adjustment circuit 120 is electrically coupled between the power supply terminal PO and the adjustment control circuits 140A and 140B to adjust the impedance of the adjustment transistors M3 and M4 to further adjust the AC cross voltage relation between the lower amplification transistor M0 and at least one of the upper amplification transistors M1 and M2 that is turned on.

It is appreciated that the embodiments described above are merely an example. In other embodiments, it should be appreciated that many modifications and changes may be made by those of ordinary skill in the art without departing, from the spirit of the disclosure.

In summary, the present invention discloses the variable gain amplification circuit and the variable gain amplification method having linearity compensation mechanism that adjust the impedance relation between the lower branch and the upper branch by disposing the first voltage adjustment circuit when the gain adjustment circuit adjusts the gain to further adjust the cross voltage relation between the lower branch and the upper branch. As a result, the variable gain amplification circuit can compensate the linearity when the gain varies to maintain a better linearity.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A variable gain amplification circuit having linearity compensation mechanism, comprising:
   an amplification circuit comprising:
      a lower branch comprising a lower amplification transistor electrically coupled between a connection terminal and a ground terminal and configured to be controlled by an alternating current (AC) input signal;
      an upper branch comprising a plurality of upper amplification transistors electrically coupled in parallel between an amplification output terminal and the connection terminal, wherein the amplification output terminal is configured to generate an AC output signal;
      a plurality of amplification control circuits each configured to control one of the upper amplification transistors to turn on and turn off according to an amplification control voltage and electrically coupled between a power supply terminal to operate according to a supply power of the power supply terminal; and
      an inductor electrically coupled between the power supply terminal and the amplification output terminal;
   a gain adjustment circuit comprising:
      a plurality of adjustment transistors electrically coupled in parallel between the power supply terminal and the connection terminal;
      a plurality of adjustment control circuits each configured to control one of the adjustment transistors to turn on and turn off according to an adjustment control voltage; and
      a first voltage adjustment circuit electrically coupled between the power supply terminal and the adjustment control circuits to adjust an impedance of the adjustment transistors to further adjust an AC cross voltage relation between the lower amplification transistor and at least one of the upper amplification transistors that is turned on.

2. The variable gain amplification circuit of claim 1, wherein each of the amplification control circuits and the adjustment control circuits includes a plurality of inverters coupled in series.

3. The variable gain amplification circuit of claim 1, wherein the first voltage adjustment circuit comprises a variable resistor configured to adjust an AC cross voltage amount relation.

4. The variable gain amplification circuit of claim 3, wherein the AC cross voltage amount relation makes an AC cross voltage of the at least one of the upper amplification transistors that is turned on have a headroom larger than a predetermined value.

5. The variable gain amplification circuit of claim 1, wherein the first voltage adjustment circuit comprises a variable capacitor, a variable inductor or a combination thereof configured to adjust an AC cross voltage phase relation.

6. The variable gain amplification circuit of claim 5, wherein the AC cross voltage phase relation makes phases of an AC cross voltage of each of the lower amplification transistor and the at least one of the upper amplification transistors that is turned on aligned.

7. The variable gain amplification circuit of claim 1, further comprising a second voltage adjustment circuit electrically coupled between the power supply terminal and the amplification control circuits to adjust an impedance of each of the upper amplification transistors to further adjust the AC cross voltage relation between the lower amplification transistor and at least one of the upper amplification transistors that is turned on.

8. The variable gain amplification circuit of claim 1, further comprising a bypass capacitor electrically coupled between the power supply terminal and the ground terminal.

9. The variable gain amplification circuit of claim 1, wherein when a number of the upper amplification transistors that are turned on increases, a gain of the A C output signal relative to the AC input signal increases accordingly, and when a number of the adjustment transistors that are turned on increases, the gain of the AC output signal relative to the A C input signal decreases accordingly.

10. The variable gain amplification circuit of claim 9, wherein the first voltage adjustment circuit adjusts the AC cross voltage relation under a condition that the gain is not affected.

11. A variable gain amplification method having linearity compensation mechanism used in a variable gain amplification circuit that comprises an amplification circuit and a gain adjustment circuit, the variable gain amplification method comprising:
   controlling a lower amplification transistor electrically coupled between a connection terminal and a ground terminal by an AC input signal, wherein the lower amplification transistor is comprised by a lower branch of an amplification circuit;
   generating an AC output signal at an amplification output terminal by a plurality of upper amplification transistors electrically coupled in parallel between the amplification output terminal and the connection terminal, wherein the upper amplification transistors are comprised by an upper branch of the amplification circuit;
   controlling one of the upper amplification transistors to turn on and turn off according to an amplification control voltage by each of a plurality of amplification control circuits electrically coupled between a power supply terminal to operate according to a supply power of the power supply terminal;

electrically coupling an inductor between the power supply terminal and the amplification output terminal;

electrically coupling a plurality of adjustment transistors of a gain adjustment circuit in parallel between the power supply terminal and the connection terminal;

controlling one of the adjustment transistors to turn on and turn off by one of a plurality of adjustment control circuits of the gain adjustment circuit according to an adjustment control voltage; and electrically coupling a first voltage adjustment circuit of the gain adjustment circuit between the power supply terminal and the adjustment control circuits to adjust an impedance of the adjustment transistors to further adjust an AC cross voltage relation between the lower amplification transistor and at least one of the upper amplification transistors that is turned on.

12. The variable gain amplification method of claim 11, wherein each of the amplification control circuits and the adjustment control circuits includes a plurality of inverters coupled in series.

13. The variable gain amplification method of claim 11, further comprising:

adjusting an AC cross voltage amount relation by a variable resistor comprised by the first voltage adjustment circuit.

14. The variable gain amplification method of claim 13, wherein the AC cross voltage amount relation makes an AC cross voltage of the at least one of the upper amplification transistors that is turned on have a headroom larger than a predetermined value.

15. The variable gain amplification method of claim 11, further comprising:

adjusting an AC cross voltage phase relation by a variable capacitor, a variable inductor or a combination thereof comprised by the first voltage adjustment circuit.

16. The variable gain amplification method of claim 15, wherein the AC cross voltage phase relation makes phases of an AC cross voltage of each of the lower amplification transistor and the at least one of the upper amplification transistors that is turned on aligned.

17. The variable gain amplification method of claim 11, further comprising:

adjusting an impedance of each of the upper amplification transistors to further adjust the A C cross voltage relation between the lower amplification transistor and at least one of the upper amplification transistors that is turned on by a second voltage adjustment circuit electrically coupled between the power supply terminal and the amplification control circuits.

18. The variable gain amplification method of claim 11, wherein the variable gain amplification circuit further comprises a bypass capacitor electrically coupled between the power supply terminal and the ground terminal.

19. The variable gain amplification method of claim 11, further comprising:

increasing a gain of the A C output signal relative to the A C input signal when a number of the upper amplification transistors that are turned on increases; and decreasing the gain of the AC output signal relative to the AC input signal when a number of the adjustment transistors that are turned on increases.

20. The variable gain amplification method of claim 19, further comprising:

adjusting the AC cross voltage relation under a condition that the gain is not affected by the first voltage adjustment circuit.

* * * * *